(12) United States Patent
Patel

(10) Patent No.: US 6,954,369 B2
(45) Date of Patent: Oct. 11, 2005

(54) NOISE REDUCTION IN A CAM MEMORY CELL

(75) Inventor: Vipul Patel, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 10/626,729

(22) Filed: Jul. 25, 2003

(65) Prior Publication Data

US 2005/0018463 A1 Jan. 27, 2005

(51) Int. Cl.[7] ................................................ G11C 7/02
(52) U.S. Cl. ........................... 365/53; 365/206; 365/49
(58) Field of Search ............................ 365/53, 206, 49, 365/189.07, 185.23, 185.12, 54

(56) References Cited

U.S. PATENT DOCUMENTS

| 5,949,696 A | * | 9/1999 | Threewitt | 365/49 |
| 6,320,777 B1 | * | 11/2001 | Lines et al. | 365/49 |
| 6,480,406 B1 | * | 11/2002 | Jin et al. | 365/49 |
| 6,717,876 B2 | * | 4/2004 | Vlasenko et al. | 365/207 |
| 2002/0015348 A1 | * | 2/2002 | Gillingham et al. | 365/227 |
| 2002/0067632 A1 | * | 6/2002 | Batson et al. | 365/49 |
| 2002/0141218 A1 | * | 10/2002 | Foss et al. | 365/49 |
| 2003/0002313 A1 | * | 1/2003 | Chadwick et al. | 365/49 |

* cited by examiner

*Primary Examiner*—Richard Elms
*Assistant Examiner*—Dang T. Nguyen
(74) *Attorney, Agent, or Firm*—Dickstein Shapiro Morin & Oshinsky LLP

(57) ABSTRACT

A dynamic CAM cell has features that reduce the effect of noise within a CAM array. By shielding the matchline from the wordline, noise transmitted from the matchline to the wordline is reduced. By placing the searchline equally distant from a bitline and the bitline complement, the noise transmitted by the searchline is received equivalently by both the bitline and the bitline complement and therefore cancelled out.

19 Claims, 9 Drawing Sheets

NOISE REDUCTION IN A CAM MEMORY CELL

FIELD OF THE INVENTION

The present invention relates generally to content addressable memory (CAM), and more specifically, to circuits and methods for reducing spurious noise in DRAM CAM cells.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data in the comparand register. When the content stored in the CAM memory location does not match the data in the comparand register, the local match detection circuit returns a no match indication. When the content stored in the CAM memory location matches the data in the comparand register, the local match detection circuit returns a match indication, e.g., a match flag. If one or more local match detection circuits return a match indication, the CAM device returns a "match" indication. Otherwise, the CAM device returns a "no-match" indication. In addition, the CAM may return the identification of the address location in which the desired data is stored or one of such addresses if more than one address contained matching data. Thus, with a CAM, the user supplies the data and gets back the address if there is a match found in memory.

Many current applications utilize ternary CAMs, which are capable of storing three logic states. For example, the three logic states are logic "0", logic "1", and "don't care". Therefore, such CAM cells require two memory cells to store the logic states, as well as a comparison circuit for comparing stored data with search data provided to the CAM.

FIG. 1 depicts a six transistor (6T) dynamic ternary (DRAM) CAM cell 100 of the prior art. The cell 100 has an "x" bit and a "y" bit. For the x bit, data is written to and read out of the cell 100 via bitline BLx 110, access transistor 160 and storage capacitor Cx 140. For the y bit, data is written to and read out of the cell 100 via bitline BLy 112, access transistor 162 and storage capacitor Cy 142. The access transistors 160, 162 are controlled by a common wordline 132. It should be understood that the storage capacitors can be discrete components or the parasitic capacitance of the line 132. Alternately, other storage or memory devices may be used to store data in the cell 100. Although not shown, other memory cells 100 in a column of a memory array are coupled either to bitline BLx 110 and bitline BLy 112 or bitline BLx* 114 and bitline BLy* 116. Although CAM cell 100 is shown as a DRAM CAM cell, the CAM cell may also be implemented using other types of memory storage, e.g., the CAM cell may use SRAM memory cells.

To store a logic "0" in the cell 100, a "1" must be written into the x bit, and a "0" must be written into the y bit of the cell 100. To store a logic "1" in the cell 100, a "0" must be written into the x bit and a "1" must be written into the y bit of the cell 100. If a "0" is stored in both the x and the y bits of the cell 100, then the cell 100 will be masked for a search operation. If a "1" is stored in both the x and the y bits of the cell 100, then the cell 100 will always indicate a mismatch for search operations.

During a search operation, a search key/word is applied to search datalines SDx 120, SDy 122, each of which is coupled to the gate terminal of compare transistors 174, 176, respectively. A first source/drain of the compare transistors 174, 176 is coupled to a common matchline 130. A second source/drain of the transistors 174, 176 is coupled to a first source/drain of transistors 170, 172, respectively. Each transistor pair 174-170 and 176-172 is referred to as a compare "stack." The applied search key is compared to data stored in the cell 100 to see if there is a match. To search for a "0," SDx is set to 0 and SDy is set to 1; to search for a "1," SDx is set to 1, and SDy is set to 0.

FIG. 2 shows a CAM array 200 and associated circuits 250, 252, 254, 256. The array 200 includes a plurality of CAM cells 100 organized as a plurality of rows and columns. Each row of CAM cells 100 is coupled to a respective wordline 132 and matchline 130, where every CAM cell 100 in the same row is mutually coupled to the wordline 132 and matchline 130 corresponding to the row. Each column of CAM cells 100 is coupled to a respective search dataline SDx 120, SDy 122, and to bitlines BLx 110, BLy 112, BLx* 114, BLy* 116, where every CAM cell 100 in the same column is mutually coupled to the search dataline SDx 120, SDy 122 and to either bitline BLx 110 and bitline BLy 112 or bitline BLx* 114 and bitline BLy* 116 corresponding to the column.

Every wordline 132 is coupled to access/decode circuit 254 and to a respective wordline driver 284. Every matchline 130 is coupled to access/decode circuit 256 and to a respective sense amplifier 286. Every search dataline SDx 120, SDy 122 is coupled to access/decode circuit 252 and to a respective search data driver 282. Every bitline BLx 110, BLy 112, BLx* 114, BLy* 116 is coupled to access/decode circuit 250.

It is known to orient the matchlines 130 substantially parallel to the wordlines 132 in the conventional CAM architecture (e.g., FIGS. 1 and 2). However, signals and other currents carried on the matchline 130 can create noise on an adjacent wordline 132. Noise on a wordline 132 can affect a charge stored on an adjacent capacitor Cx 140 or Cy 142 (FIG. 1), as the noise may cause the charge on the capacitor to leak. Accordingly, there is a desire and need to reduce noise on a CAM wordline that may be caused by the matchline.

It is also known to orient the search datalines SDx 120, SDy 122 substantially parallel to bitlines BLx 110, BLy 112, BLx* 114, BLy* 116 in the conventional CAM architecture (e.g., FIGS. 1 and 2). However, signals and other currents carried on a search dataline SDx 120, SDy 122 can create noise on an adjacent bitline BLx 110, BLy 112, BLx* 114, BLy* 116. In the operation of a CAM array, since a bitline is used to sense data and the complement of the bitline is used as a reference, if one of these two bitlines receives noise and the other does not, then data on the bitlines will be read or written incorrectly. Accordingly, there is a desire and need to reduce noise on a CAM bitlines that may be caused by the searchline.

Storage of a signal in a DRAM memory cell is inherently more unstable than storing a similar charge in a SRAM memory cell. A DRAM cell is more sensitive to noise, while the SRAM has a strong resistance to noise. Consequently, spurious noise in a memory array is more likely to perturb a DRAM memory cell than a SRAM memory cell. Therefore, it is desirable to reduce the effect of spurious noise in the circuitry of the DRAM CAM array.

BRIEF SUMMARY OF THE INVENTION

The present invention provides circuits that reduce the effect of spurious noise in the circuitry of a CAM array. In an exemplary embodiment, a grounded noise shield between a wordline and a matchline reduces the transmission of noise from the matchline to the wordline.

In another exemplary embodiment, a searchline is positioned symmetrically over complimentary pairs of bitlines. As a result, noise generated by the searchline is received by both bitlines and the resulting signal errors cancel each other out.

BRIEF DESCRIPTION OF THE DRAWINGS

These and other advantages and features of the invention will be more clearly understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or other changes may be made to the specific embodiments disclosed without departing from the spirit and scope of the present invention.

Figure 1:
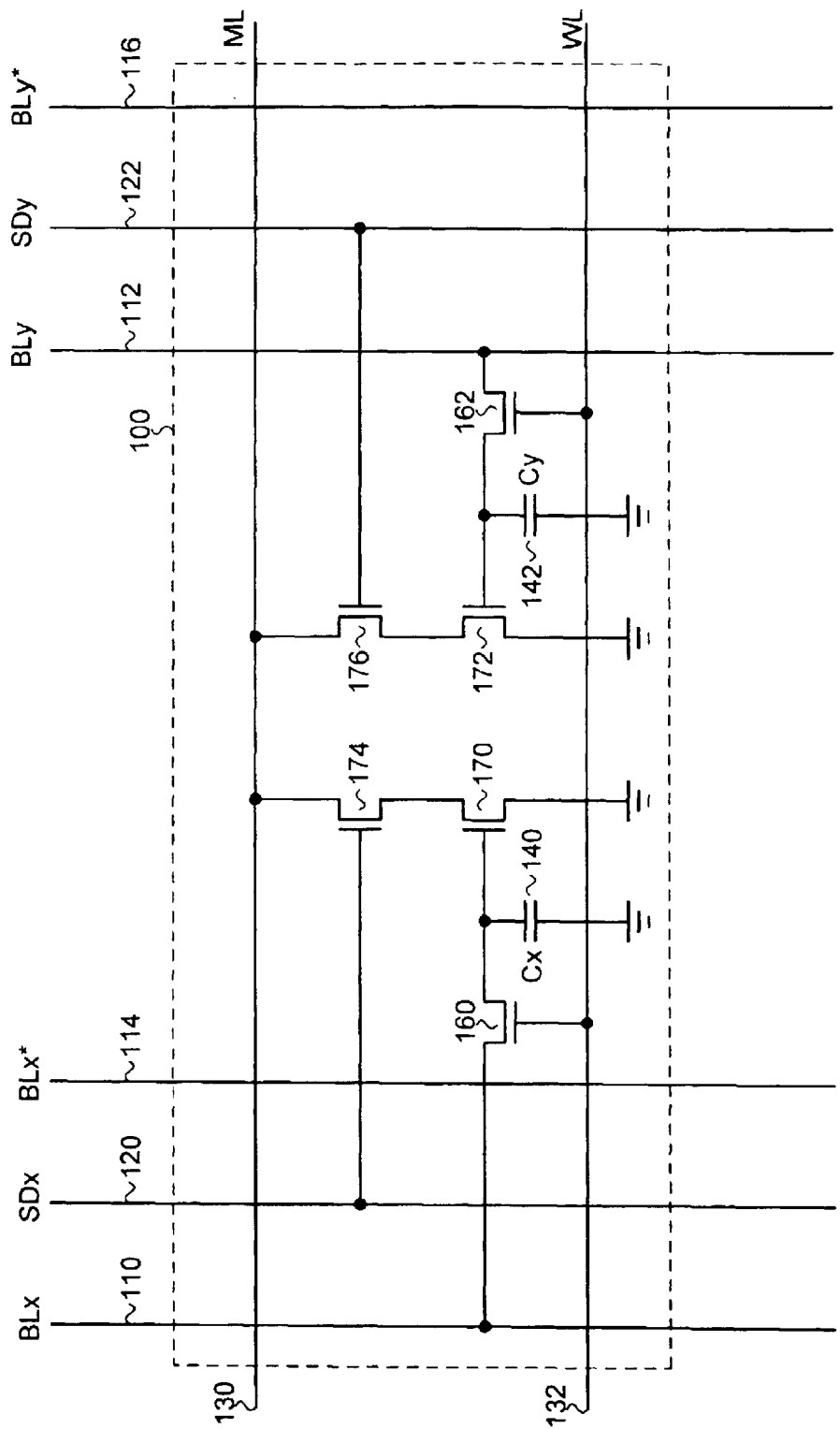
FIG. 1 is a schematic circuit diagram of a CAM cell in the prior art.
Figure 2:
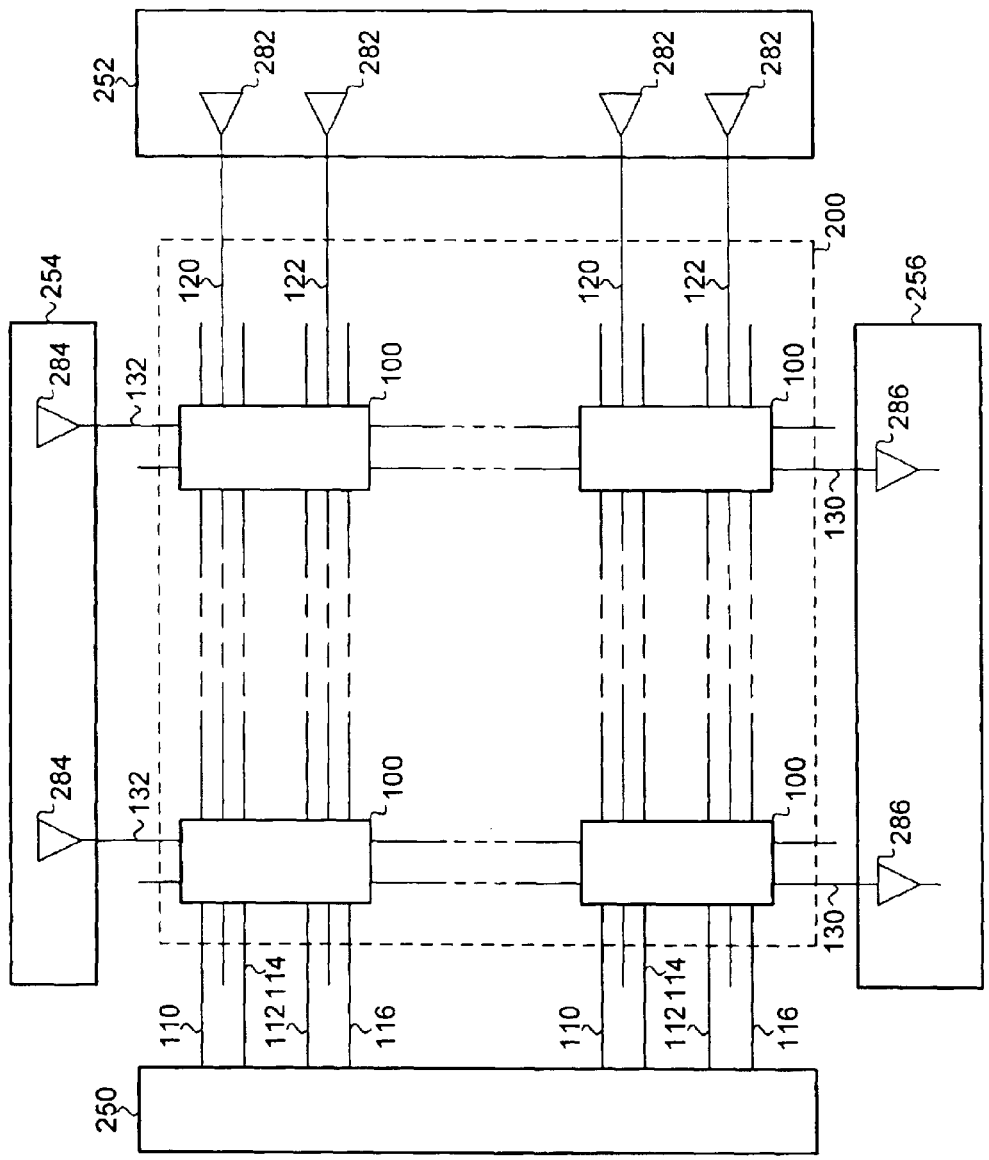
FIG. 2 is a block diagram of a CAM array including the CAM cell of FIG. 1.
Figure 3:
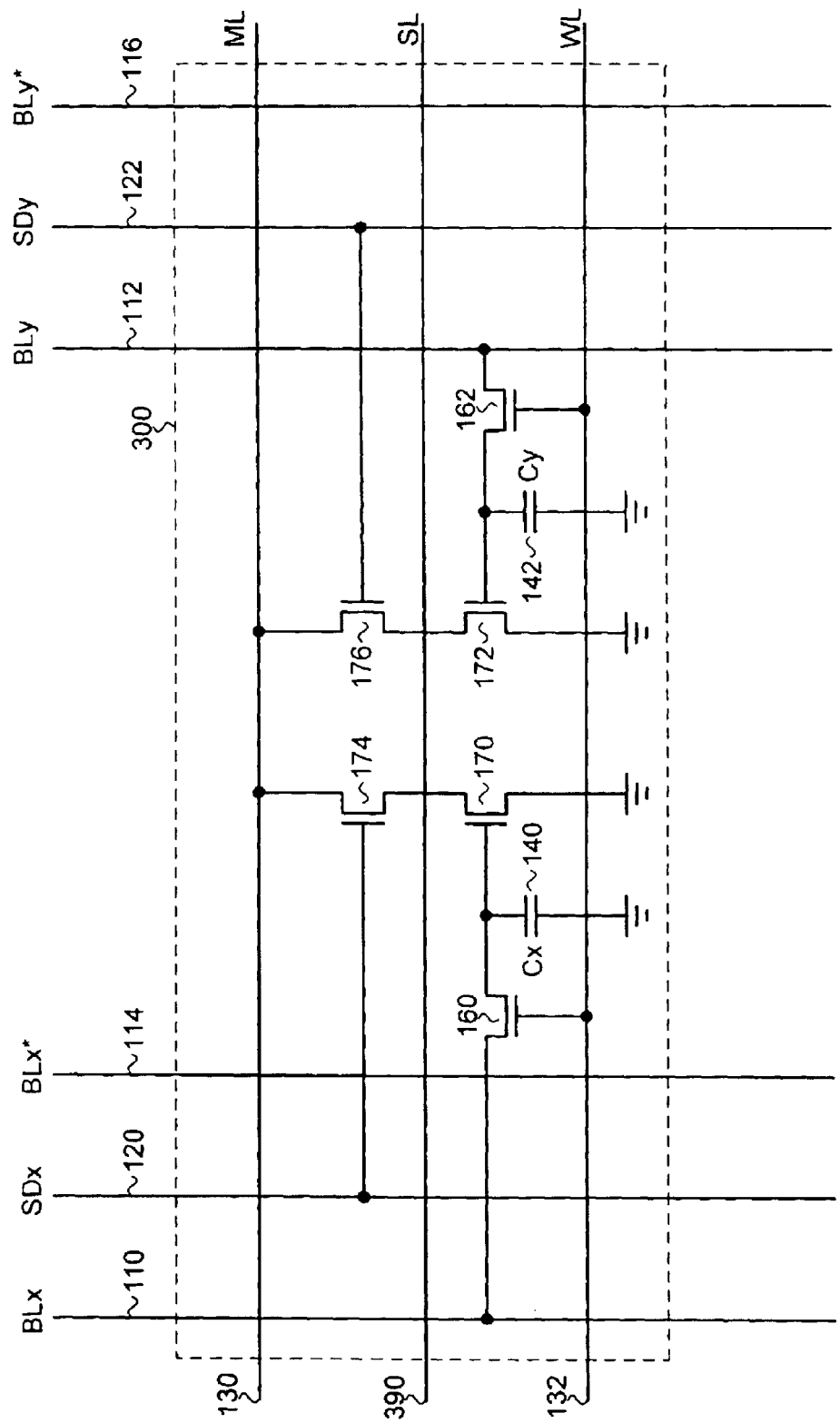
FIG. 3 is a schematic circuit diagram of a CAM cell in accordance with an exemplary embodiment of the invention.

FIG. 3 is a schematic diagram of a CAM cell 300 in accordance with an exemplary embodiment of the invention. The CAM cell 300 of FIG. 3 differs from the CAM cell 100 of FIG. 1 in that CAM cell 300 includes shieldline (SL) 390. As seen in FIG. 3, shieldline 390 is disposed between and parallel to matchline 130 and wordline 132. Shieldline 390 is desirably formed from copper) but may be constructed of any conductive material. Although not shown in FIG. 3, shieldline 390 is coupled to a ground potential (i.e., grounded). Because the grounded shieldline 390 is between the matchline 130 and wordline 132, the shieldline 390 absorbs noise generated by the matchline 130. For example, if matchline 130 operates at high frequencies, shieldline 390 isolates wordline 132 from the resulting high frequency emissions, which could otherwise couple to wordline 132 and produce noise and possibly signal errors. Consequently, the amount of noise received by the wordline 132 is reduced. The reduction of noise in the wordline 132 also reduces the effect that the noise on the wordline 132 has on the charge of the capacitors 140, 142 within the CAM cell 300.

Figure 4:
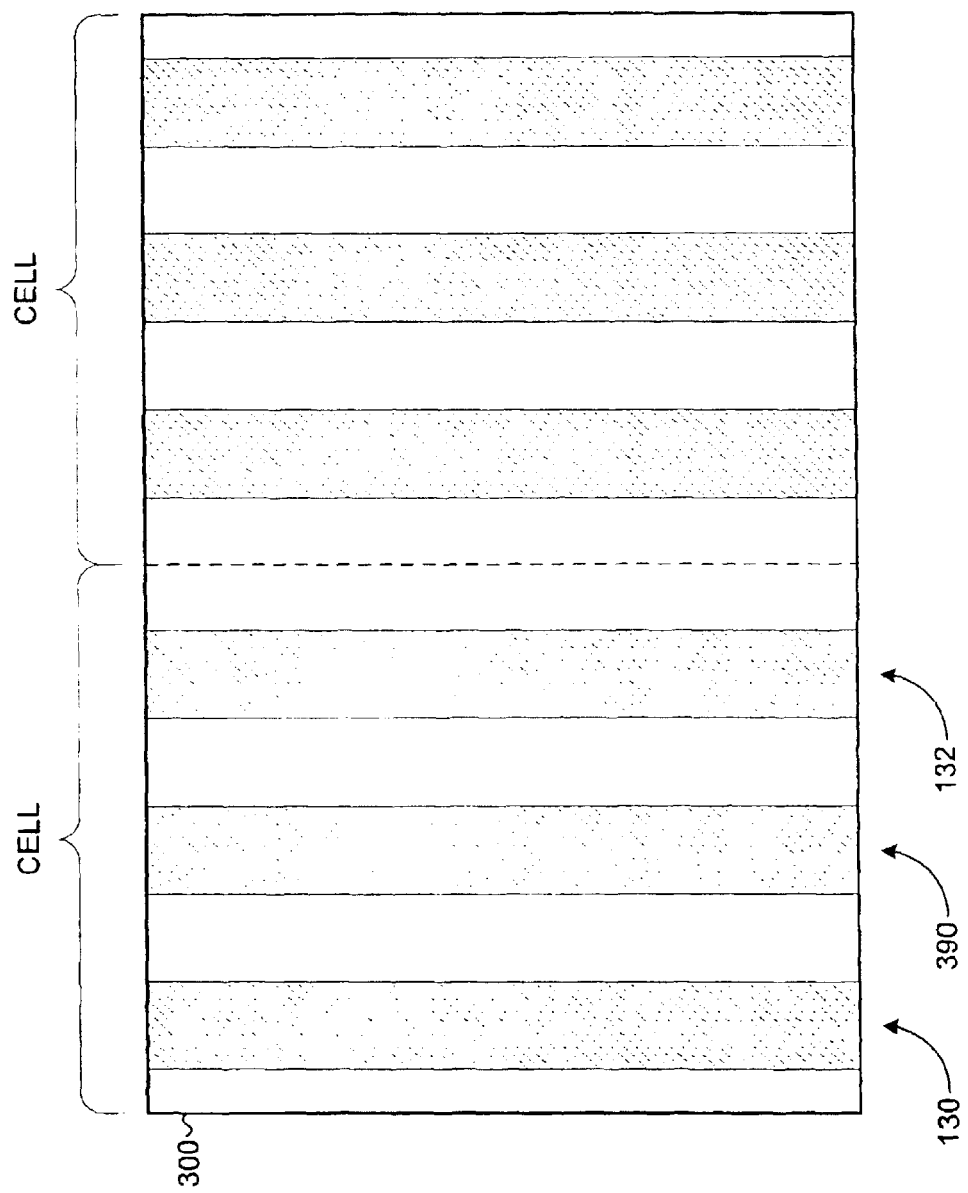
FIG. 4 is a mask layer diagram of the CAM cell of FIG. 3 in accordance with an exemplary embodiment of the invention.

FIG. 4 shows a mask layer diagram of CAM cell 300 in accordance with an exemplary embodiment of the invention. The illustrated shieldline 390 is disposed between matchline 130 and wordline 132. All three lines 390, 130, 132 are also disposed within the same metal layer to minimize the height required to build the CAM cell 300.

Figure 5:
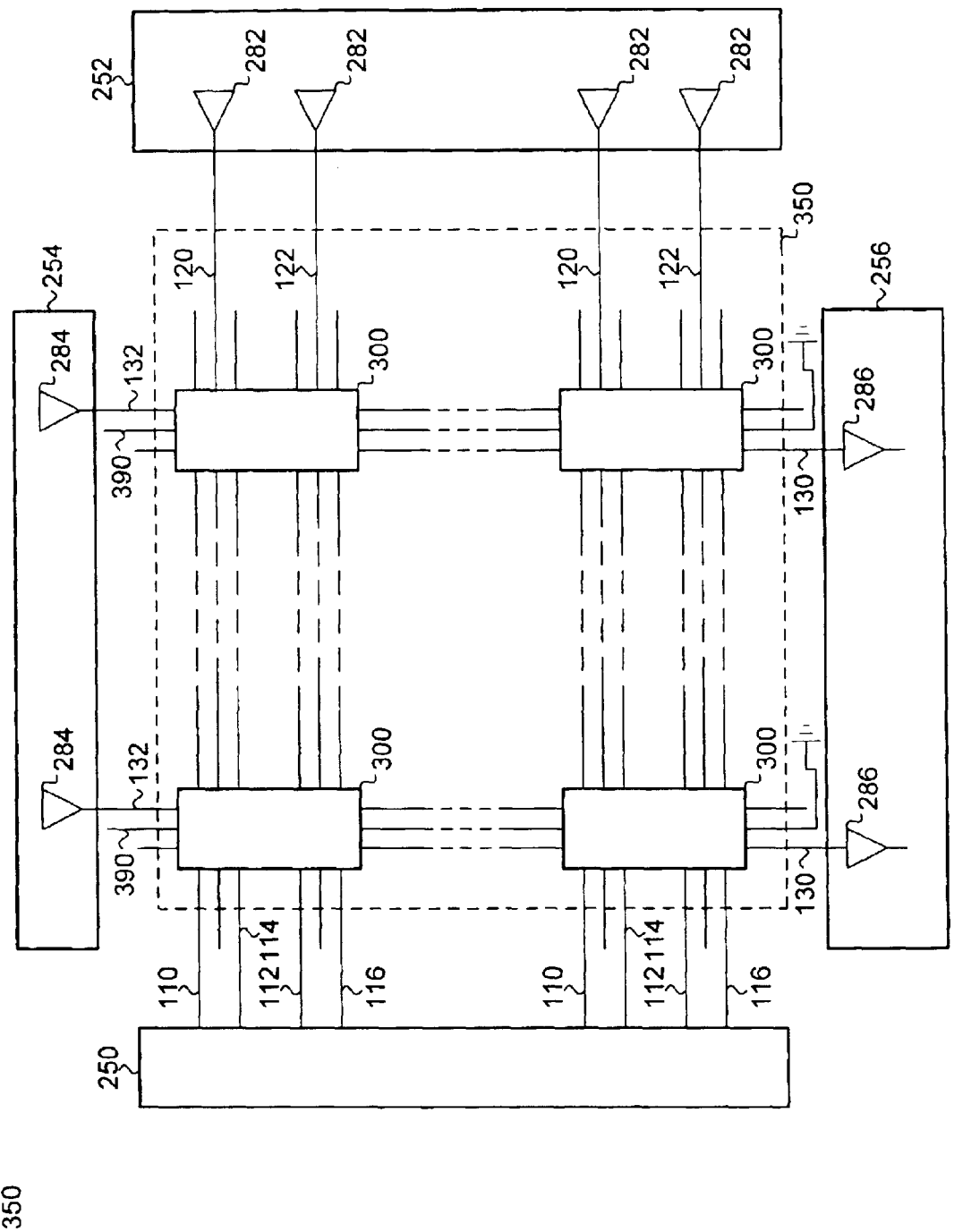
FIG. 5 is a block diagram of a CAM array including the CAM cell of FIG. 3 and associated circuits in accordance with an exemplary embodiment of the invention.

FIG. 5 is a block diagram of a CAM array 350 including the CAM cell 300 of FIG. 3 and associated circuits 250, 252, 254, 256 constructed in accordance with an exemplary embodiment of the invention. In a preferred embodiment the shieldline 390 extends the entire width of the row of the CAM array 350, corresponding to length of the wordline 132 in the row. Otherwise, the array 350 contains conventional CAM cells components 110, 112, 114, 116, 120, 122, 300 as described above.

Figure 6:
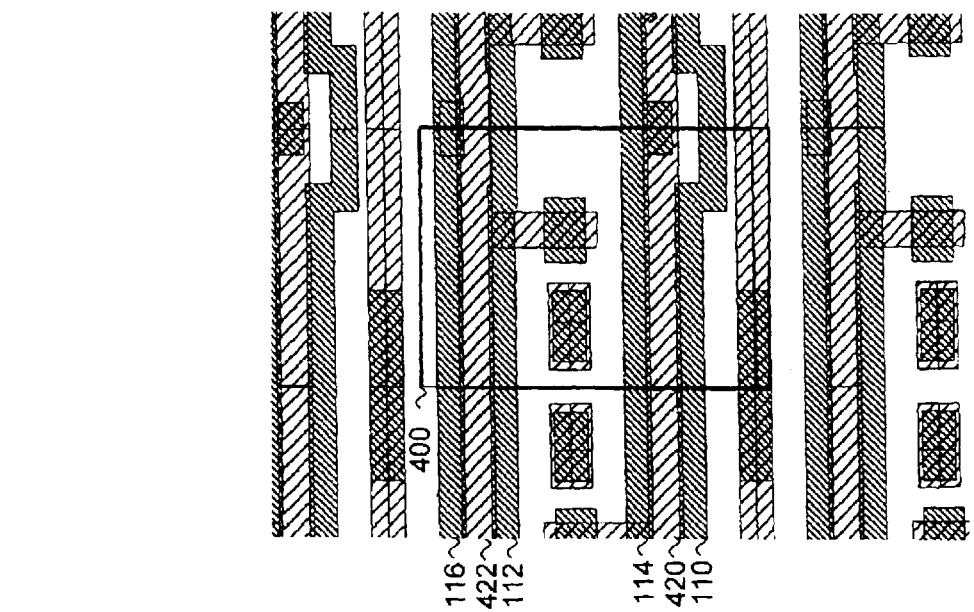
FIG. 6 is a mask layer diagram showing a portion of a CAM array in accordance with another exemplary embodiment of the invention.

FIG. 6 is a mask layer diagram showing a portion of the CAM array 350 in accordance with another exemplary embodiment of the invention. As seen in FIG. 6, CAM array 350 includes at least one CAM cell 400. The CAM array 350 differs from the CAM array 100 (FIG. 1) in that the searchlines 420, 422 are each placed symmetrically over a complementary pair of bitlines 110, 114 and 112, 116, respectively. By placing a searchline equidistant from a complementary pair of bitlines (e.g., searchline 420, bitlines 110, 114), noise generated by the searchline 420 will be received equally by both bidines 110, 114.

Regarding each pair of complementary bitlines, when one bit line is used to sense data, the other is being used as a reference, and vice versa. When searchline 420, for example, operates at high frequency, the resulting high frequency emissions could otherwise couple more strongly to one of the bitlines in the pair. This could produce noise on the more strongly coupled bitline and not on the other, and thus, data on the bitlines would be read or written incorrectly. If searchline 420 is positioned symmetrically and equidistant from bitlines 110 and 114, however, the coupling of noise to both bitlines 110, 114 will be approximately equal. Therefore, there will be substantially the same noise in both lines 110, 114, which will be offset and cancelled out. The cancellation of the noise reduces the effect of noise on the sense operation. In an exemplary embodiment, the searchline 420 is formed in a layer different from the metal layer that contains complementary bitlines 110, 114; the invention, however, is not limited to such an arrangement. For example, a metal layer containing the searchline 420 constitutes a first layer, and a second metal layer contains bitlines 110 and 114, where the first layer is parallel to and above the second layer. Alternatively, the first layer is coplanar to the second layer.

Although depicted separately in FIGS. 3–6, the concepts of the invention could be used together. That is, in another embodiment, a CAM cell has both a shieldline disposed between matchline and wordline, and searchlines placed symmetrically relative to complementary bitlines. This arrangement would have all of the benefits described above with regard to FIGS. 3–6.

Figure 7:
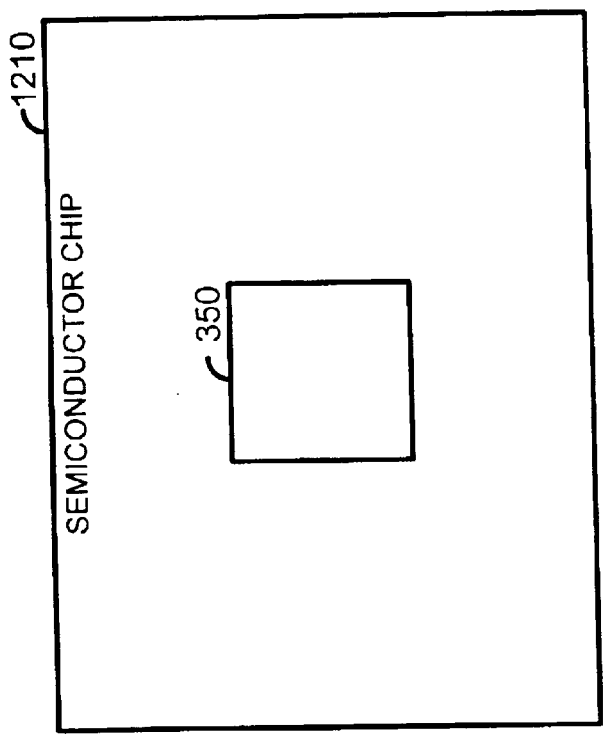
FIG. 7 is a diagram of a semiconductor chip with an integrated circuit that includes a CAM array constructed in accordance with exemplary embodiment of the invention.

FIG. 7 depicts a CAM array 350, as described in connection with FIGS. 3–6 that is included on an integrated circuit formed on a semiconductor memory chip 1210 so that it may be incorporated into a router or other processor system (as described below).

Figure 8:
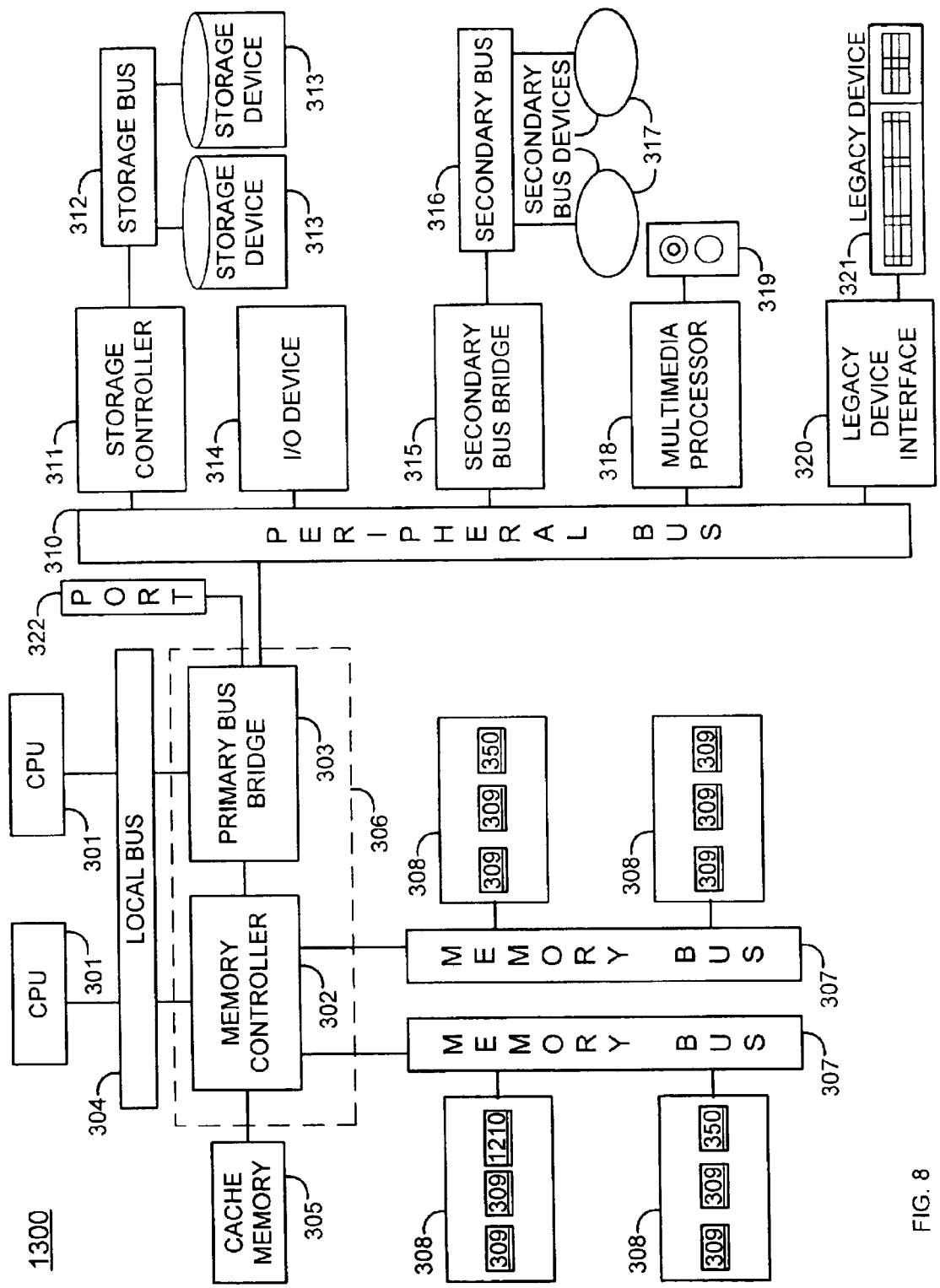
FIG. 8 is a schematic diagram of a processor system employing the CAM array of FIG. 7 as part of a CAM device, in accordance with another exemplary embodiment of the invention.

FIG. 8 illustrates an exemplary processing system 1300 that employs a CAM array 350 as described in relation to FIGS. 3–7. The processing system 1300 includes one or more processors 301 coupled to a local bus 304. A memory controller 302 and a primary bus bridge 303 are also coupled the local bus 304. The processing system 1300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308. Any one of memory components 308 may contain a semiconductor chip 1210 as described in relation to FIG. 7 or a CAM array 350 described in connection with FIGS. 3–6.

The memory components 308 may be a memory card or a memory module. The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 1300 include peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, a miscellaneous I/O device 314, a secondary bus bridge 315, a multimedia processor 318, and a legacy device interface 320. The primary bus bridge 303 may also be coupled to one or more special purpose high-speed ports 322. In a personal computer, for example, the special purpose port might be the Accelerated Graphics Port (AGP), used to couple a high performance video card to the processing system 1300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be a local area network interface, such as an Ethernet card. The secondary bus bridge may be used to interface additional devices via another bus to the processing system. For example, the secondary bus bridge may be a universal serial port (USB) controller used to couple USB devices 317 via to the processing system 1300. The multimedia processor 318 may be a sound card, a video capture card, or any other type of media interface, which may also be coupled to additional devices such as speakers 319. The legacy device interface 320 is used to couple legacy devices, for example, older styled keyboards and mice, to the processing system 1300.

The processing system 1300 illustrated in FIG. 8 is only an exemplary processing system with which the invention may be used. While FIG. 8 illustrates a processing architecture especially suitable for a general-purpose computer, such as a personal computer or a workstation, it should be recognized that well known modifications can be made to configure the processing system 1300 to become more suitable for use in a variety of applications. For example, many electronic devices that require processing may be implemented using a simpler architecture that relies on a CPU 301 coupled to memory components 308 and/or memory devices 309. The modifications may include, for example, elimination of unnecessary components, addition of specialized devices or circuits, and/or integration of a plurality of devices.

Figure 9:
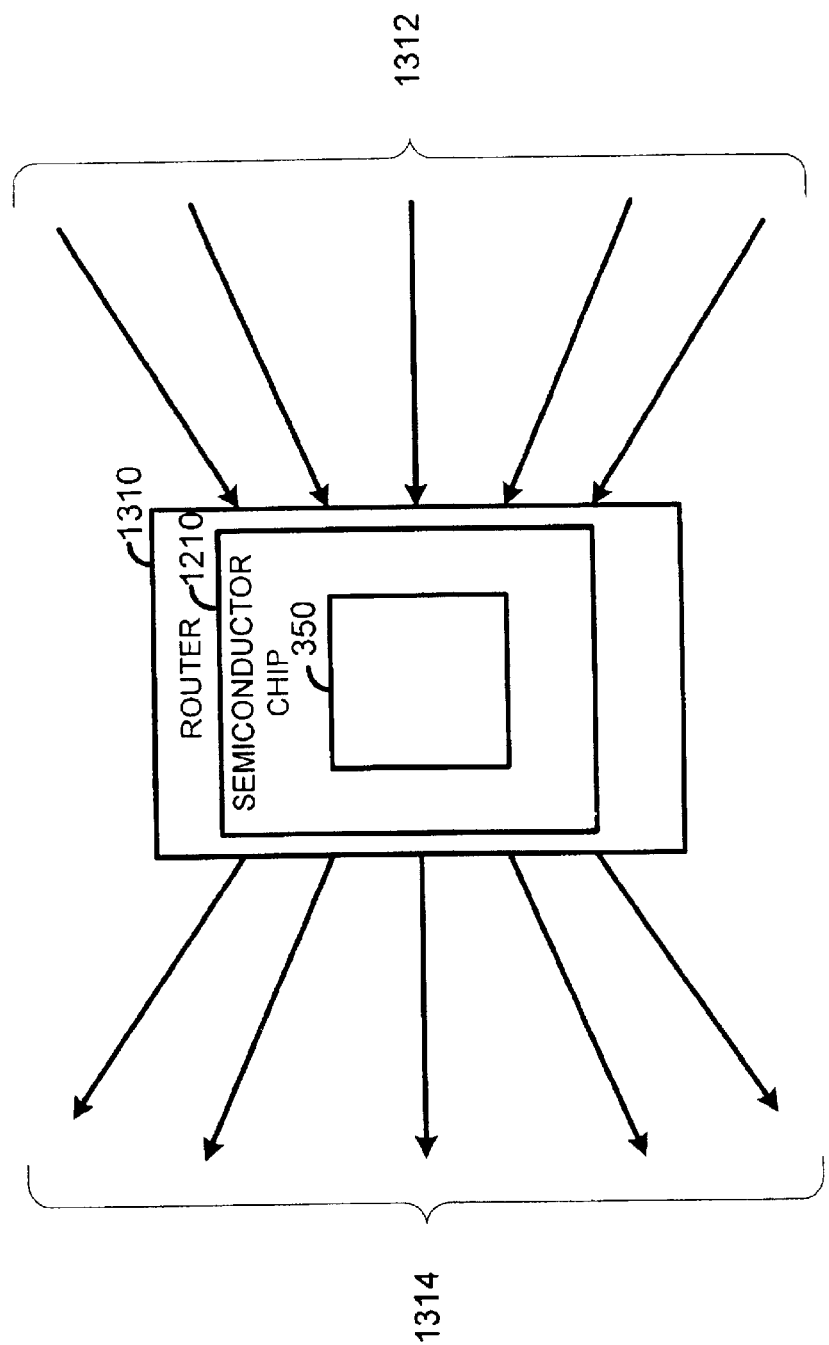
FIG. 9 is a schematic diagram of a router employing the CAM array of FIG. 7 as part of a CAM device, in accordance with another exemplary embodiment of the invention.

FIG. 9 is a simplified block diagram of a router 1310 as may be used in a communications network, such as, e.g., part of the Internet backbone. The router 1310 contains a plurality of input lines 1312 and a plurality of output lines 1314. When data is transmitted from one location to another, it is sent in a form known as a packet. Oftentimes, prior to the packet reaching its final destination, that packet is first received by a router, or some other device. The router 1310 then decodes that part of the data identifying the ultimate destination and decides which output line 1314 and what forwarding instructions are required for the packet.

Generally, CAMs are very useful in router applications because historical routing information for packets received from a particular source and going to a particular destination is stored in the CAM of the router. As a result, when a packet is received by the router 1310, the router already has the forwarding information stored within its CAM. Therefore, only that portion of the packet that identifies the sender and recipient need be decoded in order to perform a search of the CAM to identify which output line 1314 and instructions are required to pass the packet onto a next node of its journey.

Still referring to FIG. 9, router 1310 contains the added benefit of employing a semiconductor memory chip 1210 containing a CAM array 350 (FIG. 7) of the invention. Thus, the router 1310 benefits from a CAM array 350 having reduced noise and overall better operation than conventional CAM arrays (e.g., FIG. 1).

Although the systems described above with respect to FIGS. 7–9 are discussed in reference to incorporating an exemplary embodiment of the invention, the systems are not so limited and can incorporate any of the embodiments of the invention described above.

While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A content addressable memory (CAM) cell, comprising:
   a matchline;
   a wordline; and
   a shieldline positioned between said matchline and said wordline for shielding electrical noise from said matchline, said shieldline being electrically separate from said matchline while shielding said wordline.

2. The CAM cell of claim 1, wherein said shieldline is coupled to a ground potential.

3. The CAM cell of claim 1, wherein said shieldline is made of metal.

4. The CAM cell of claim 1, wherein said shieldline is made of copper.

5. A content addressable memory (CAM) cell, comprising:
   a wordline;
   a matchline; and
   shielding means for shielding said wordline from noise from said matchline, said shielding means being electrically separate from said matchline while shielding said wordline.

6. The CAM cell of claim 5, wherein said shielding means is a conductive material.

7. The CAM cell of claim 6, wherein said shielding means is coupled to a ground potential.

8. An integrated circuit, comprising:
   a content addressable memory (CAM) cell, comprising:
   a matchline;
   a wordline; and
   a shieldline positioned between said matchline and said wordline for shielding electrical noise from said matchline, said shieldline being electrically separate from said matchline while shielding said wordline.

9. The circuit of claim 8, wherein said shieldline is coupled to a ground potential.

10. The circuit of claim 8, wherein said shieldline is made of copper.

11. An integrated circuit, comprising:
    a content addressable memory (CAM) cell, comprising:
    a wordline;
    a matchline; and
    shielding means for shielding said wordline from noise from said matchline, said shielding means being electrically separate from said matchline while shielding said wordline.

12. The circuit of claim 11, wherein said shielding means is a conductive material.

13. The circuit of claim 11, wherein said shielding means is coupled to a ground potential.

14. A router, comprising:
    a content addressable memory (CAM) cell, comprising:
    a wordline;
    a matchline; and
    shielding means for shielding said wordline from noise from said matchline, said shielding means being electrically separate from said matchline while shielding said wordline.

15. The router of claim 14, wherein said shielding means is a conductive material.

16. The router of claim 14, wherein said shielding means is coupled to a ground potential.

17. A processor system, comprising:
    a processor; and
    a content addressable memory (CAM) cell, comprising:
    a wordline;
    a matchline; and
    shielding means for shielding said wordline from noise from said matchline, said shieldline being electrically separate from said matchline while shielding said wordline.

18. The processor of claim 17, wherein said shielding means is a conductive material.

19. The processor of claim 17, wherein said shielding means is coupled to a ground potential.

* * * * *